Figure 1:
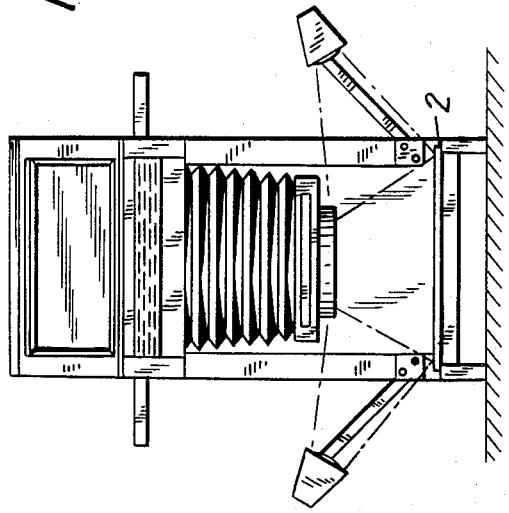

United States Patent [19]

Walsh

[11] Patent Number: 4,493,552

[45] Date of Patent: Jan. 15, 1985

[54] MODULAR PAGE COMPOSITION SYSTEM

[76] Inventor: Jack Walsh, 500 Pittsfield Rd., P.O. Box 1787, Lenox, Mass. 01240

[21] Appl. No.: 479,266

[22] Filed: Mar. 28, 1983

[51] Int. Cl.³ .............................................. G03B 27/62
[52] U.S. Cl. ........................................ 355/75; 355/77
[58] Field of Search ...................................... 355/75, 77

[56] References Cited

U.S. PATENT DOCUMENTS 4,028,107 6/1977 Henley ................................... 355/75

Primary Examiner—Monroe H. Hayes
Attorney, Agent, or Firm—Jordan B. Bierman

[57] ABSTRACT

A method and means are provided to facilitate the composition of the layout of material such as the comic and puzzle pages of a newspaper. This is accomplished by employing translucent plastic modules cut to established size standards upon which the artwork to be supported is pasted. These modules with attached artwork are then assembled as desired upon a translucent plastic copy board, locked in place and photographed. The photographs of the modules and applied artwork can be distributed to newspapers desiring to reproduce the comic and puzzle pages so assembled.

4 Claims, 6 Drawing Figures

MODULAR PAGE COMPOSITION SYSTEM

This invention lies in the field of the preparation of layouts for newspapers, and particularly in the manner of composing such layouts for the comic and puzzle pages of a newspaper; the invention is particularly well adapted for this purpose but will undoubtedly find use in the composition of many different types of layouts.

using comics, puzzles, box features or artwork as examples, these being generally assembled on a full or half sheet in most of the 1700 newspapers published in the United States, such material generally arrives by mail on individual glossy "repro" proofs from as many as six to fifteen syndicates, depending upon the size of the newspaper. While there is a supposed industry standard for the sizing of the various strips and panels, unfortunately for many reasons they are not adhered to so that if a newspaper desires uniformity in the size of its comic page components, it often has to rephotograph a certain number of the strips and panels before the final composition of a page can be started. This is obviously a time-consuming and wasteful process.

Furthermore, the comic strips and panels arrive on master sheets from which they have to be stripped and then sorted out each week for each of the daily pages. When this has been done the type for the titles of the comics and the puzzles must be set on a photocopying machine then stripped and matched with the respective artwork.

The next step is a paste-up on a cardboard page form, usually marked with blue, non-photographic gridlines. Even with such lines it requires a T-square and a good deal of craftwork with wax-paste machines, razor blades or ex-acto knives to put a page together.

As a final step the newspaper may elect either to shoot a full-page mechanical or use the paste-up to go directly under a plate-making camera. The latter method, which saves the cost of an extra sheet of film, tends to be unsatisfactory because often the pasted-down material becomes pushed out of line, or fragments are dropped in the platemaking process.

It will thus be apparent from the above that what might appear to be a simple daily/weekly task in the composition of the comic/puzzle page of newspapers throughout the United States involves a larger number of small, time-consuming and sometimes frustrating and often wasteful steps. As the same procedure is followed at each of the 1700 or more published newspapers, the gross man-hours used is, to say the least, not inconsiderable.

The primary object of the present invention is to provide a method and means which will avoid the substantial effort and waste now inherent in the present methods of composing comic strip layouts, for example, in the manner above outlined.

More specifically, it is an object to develop a system by means of which newspapers can have their comic pages delivered pre-assembled, using the comic or other content which they have selected, such pages being capable of going to engraving cameras each day of the week.

Another object of this invention in furtherance of the prior objectives is to provide a system in which all artwork is shot to establish standard sizes, with the indicated elements (modules or panels) quickly and accurately interchangeable from one newspaper to another in accordance with their individual requirements.

More comprehensively, it is proposed by reason of the hereinafter described apparatus and method, to establish a central composing and layout station at which the comic strips and like artwork are each placed upon an individual module, assembled and composed in accordance with the comic and artwork selected by an individual newspaper, with the entire sheet then sent to individual papers for reproduction with no work necessary on the part of the such papers. The modular design and assembly method of this present invention makes such a system practical and obviously less expensive for all 1700 comic-carrying papers. The re-photographing, cutting, assembly and pasting at each of those newspapers is thereby completely avoided.

Figure 2:
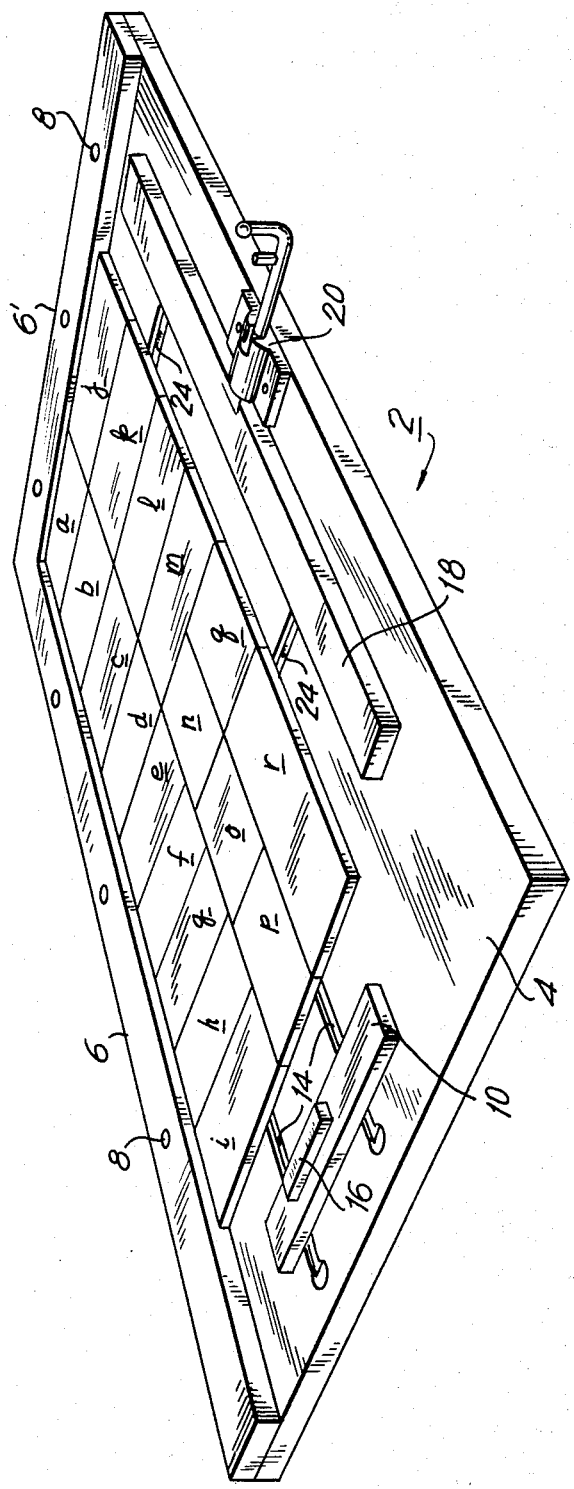
Figure 3:
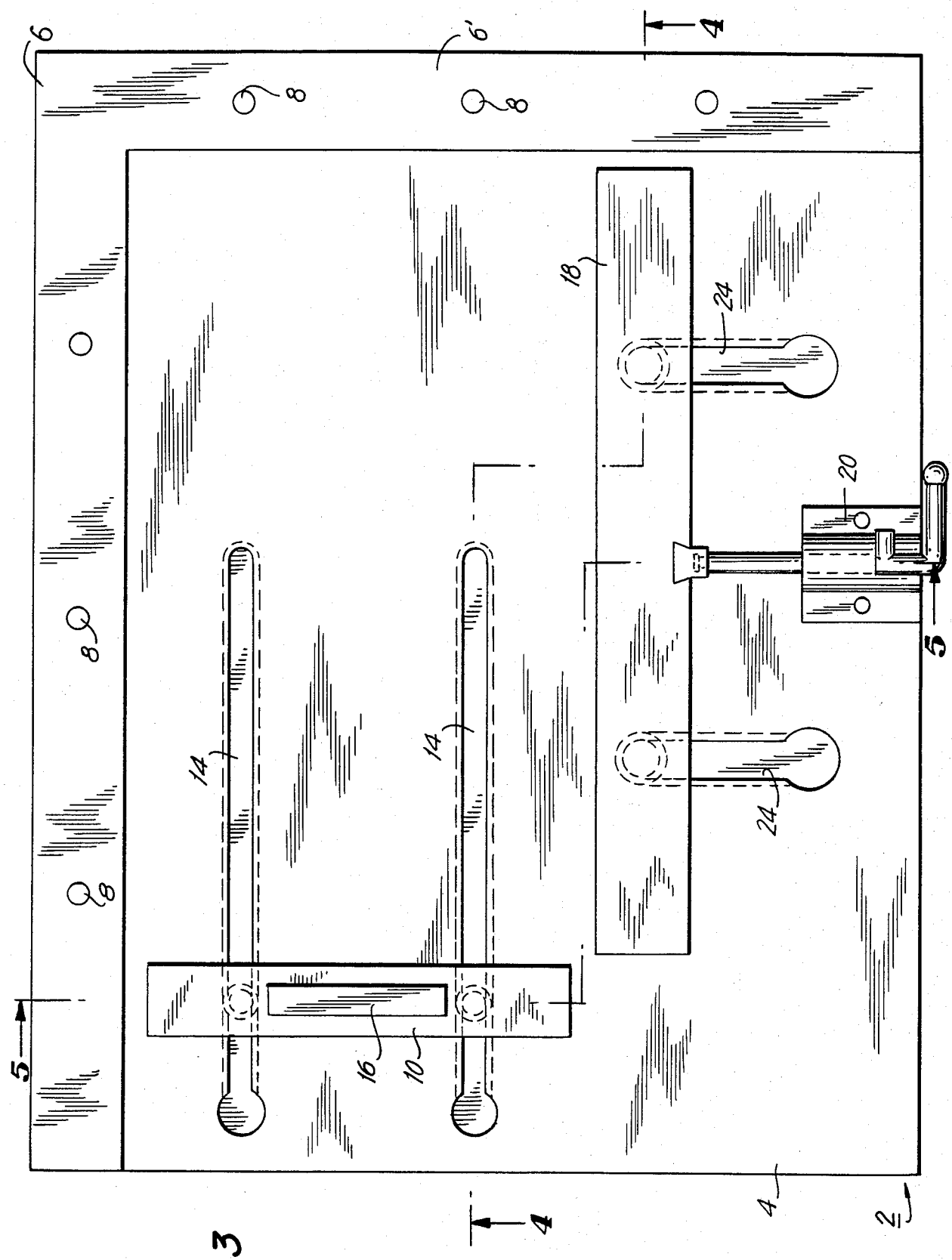
Figure 4:
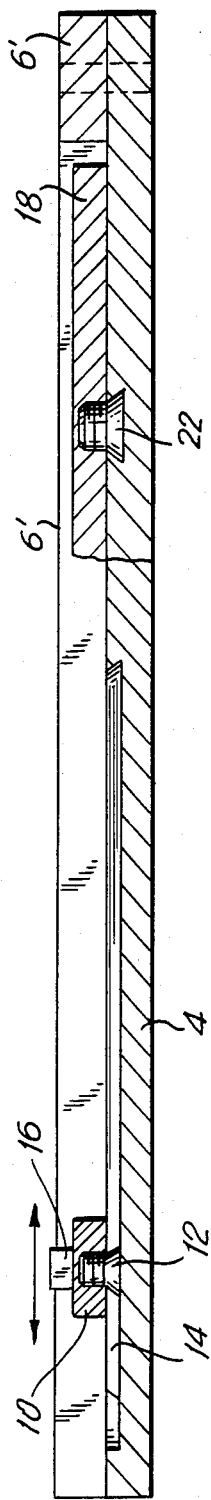
Figure 5:
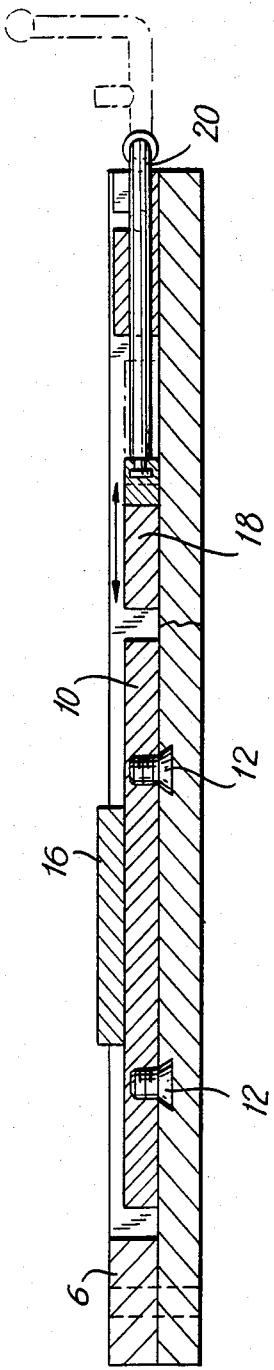
Figure 6:
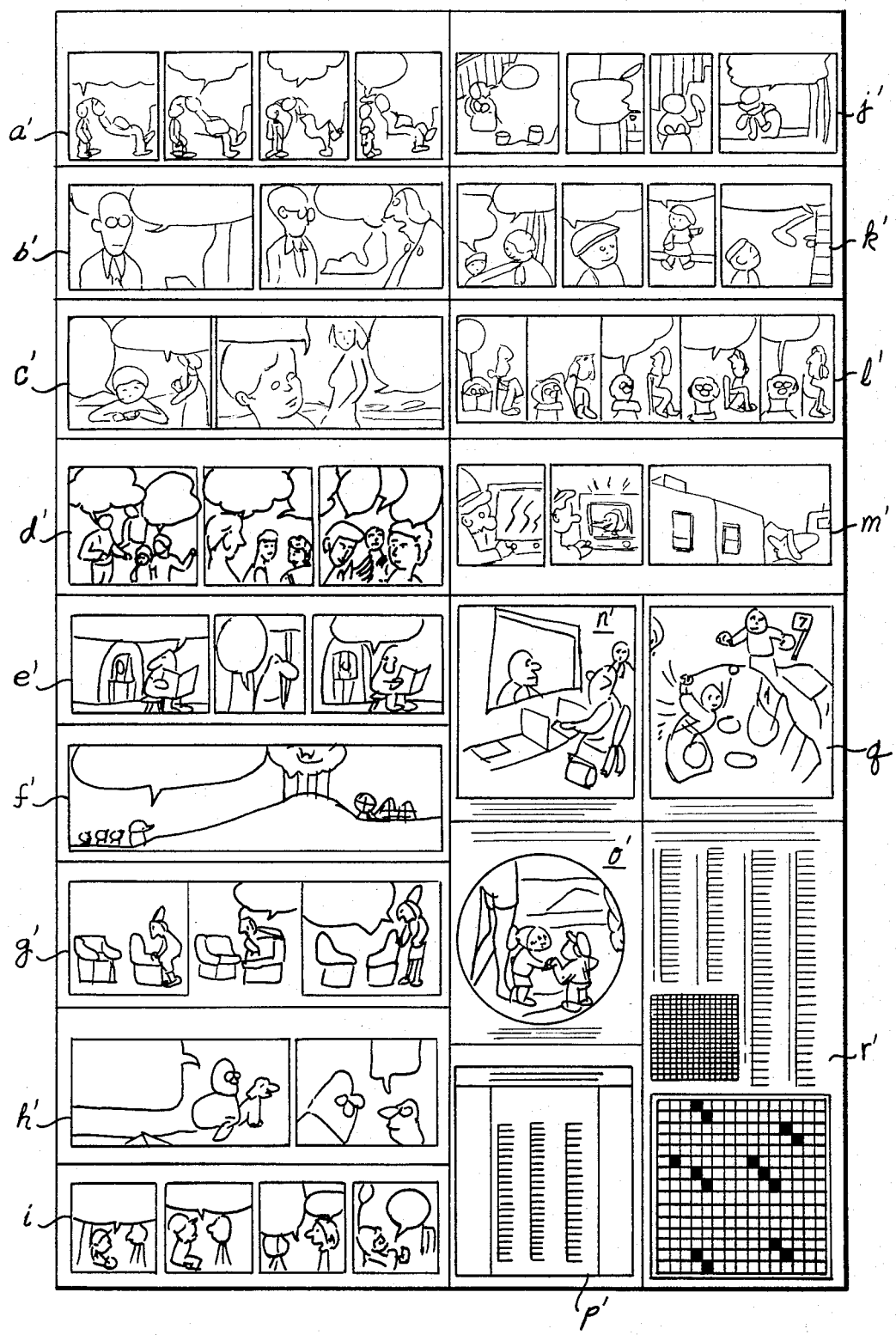

These and other objects and advantages of the invention will become apparent from the description which follows, read in connection with the accompanying drawings, in which:

FIG. 1 is a diagrammatic front plan view showing the relationship between a copy board and camera for the purpose of the present invention, FIG. 2 is a perspective view of a copy board of the present invention, FIG. 3 is a top plan view of the copy board illustrated in FIG. 2, FIG. 4 is a longitudinal cross-sectional view of the copy board taken along the line 4—4 of FIG. 3, FIG. 5 is a transverse cross-sectional view of the copy board taken along the line T—T of FIG. 3; and FIG. 6 is an example of a newspaper comic/puzzle page illustrating strips assembled in accordance with my invention.

FIG. 1 is illustrative of a copy board-camera assembly known and readily available in the prior art. Typically, but not necessarily, a vertically positioned camera is used, the equipment being utilized as a contact printer with enlarger and reducer. My invention, which utilizes this known assembly, embodies a special form of copy board 2 as well as a novel method of employing the known equipment. Such camera assemblies can come equipped with means (now shown) for back-lighting the copy board from below. For the purposes of the present invention such back-lighting will be used.

Details of the copy board are shown in FIGS. 2, 3, 1, 4 and 5. For the purposes in mind this copy board comprises a flat, preferably rectangular plate 4 formed of any suitable translucent plastic, along two sides of which are attached raised edge or border strips 6,6'. These strips may be attached as by screws 8, laminated to plate 4, or cast as one piece therewith. If these strips are separate from the plate, they may be formed of the same or different material. Plate 4 is of sufficient size to permit the assembly of the necessary number and modules comprising the totality of the comic strips, puzzles and other features making up a half-page, or a full comic page as illustrated in FIG. 6. For this said purpose plate 4 is generally rectangular, since this is the usual newspaper format, but of course my invention is not so limited. The copy board illustrated will preferably measure 20"×24" as this is the size that works best with standard size newspaper pages; smaller sizes can be used for tabloids or magazines. Individual modules a-r corresponding to the introduced comic strips and other artwork a'-r' in FIG. 6 are placed upon copy board 2 in FIG. 2. These modules formed of a translucent plate material are shown for the sake of clarity without the comic strips or artwork pasted thereon. It has been found that about twenty different sizes of modules are sufficient for most newspaper comic and puzzle pages.

Means are provided for tightly assembling and holding the modules in place for photography. Such means may consist of a simple slidable straight-edge guide 10 having means such as screws or projections 12 engaging undercut grooves or tracks 14 formed in plate 4. Guide 10 may be provided with a handle 16.

Guide 10 has been shown as applied to the shorter side of the assembled modules while another type of guide 18 having means such as a bolt lock 20 attached thereto holds the modules firmly in place against the long side of the assembled modules. Like guide 10, guide 18 may have dependent screws 22 slidable in undercut grooves or tracks 24 also formed in plate 4. It is desirable but not necessary that one edge of the assembled modules can be locked in place, as shown.

The above-designed copy board is an essential element in the new method of assembling and composing a comic strip page, as described below.

For the purposes of this invention it is assumed that the comic strips and other artwork, coming as they do from perhaps 15 or more syndicates, instead of being individually sent to the 1700 or more individual newspapers, are directed to one central depositing and composing station. As previously pointed out, due to individual idiosyncrasies, instead of following established standards, the individual strips and panels so differ in size, that many of them have to be rephotographed before assembling and composing them on a page can begin. In accordance with the present invention, instead of assembling desired strips and panels on a paste-up cardboard page, as is usually done for each individual newspaper, they are re-photographed, if necessary, and then pasted upon the individual modules of translucent plastic, such as shown in FIGS. 2 and 6.

With each comic strip and each feature such as a panel, cross-word puzzle etc. printed on its own module, they can be assembled as shown in FIG. 2, and then photographed to produce full page such as shown in FIG. 6. Since plate 4 and the individual modules are all translucent and back-lighted, the separating line between modules will not show on the photographed page; all that the actual photo produces is the artwork and type pasted onto the modules.

The photographed page is forwarded to the newspaper which no longer has the problem of assembling and composing its comic page.

Since the method involves the use of a central composing station with the individual strips and artwork pre-pasted on individual modules, not only is composing and assembly time at each newspaper saved, but the modular system permits fast assembly and composition for the different newspapers served. In fact, many of the papers will have identical layouts using the same syndicated features so that one assembly can be photographed and transmitted to all such papers. Even if each paper had its own peculiar composition, the modular system described results in swift and accurate composition work.

The invention has been described in a preferred form both as to the mechanical elements utilized and in the steps forming the method in question. Simple mechanical changes coming within the scope of those skilled in the art can be envisaged as falling within the scope of the invention, as well as incorporating in the method outlined, different techniques in handling, photographing etc. than those specifically described herein by way of example.

Accordingly, the invention is not deemed limited to the examples described and illustrated, but only as set forth in the claims which follow.

I claim:

1. Copy board for composing an assembly of translucent modules each bearing individual artwork thereon comprising a flat four sided plate of translucent material, means forming raised borders along two adjacent edges of said plate, means forming a first pair of spaced-apart parallel grooves in said plate, said grooves extending parallel to one raised border of said plate each beginning at a point near the edge of a plate opposite to the other raised border thereof and extending a substantial distance toward said other border, means forming a second pair of spaced-apart parallel grooves in said plate, said second pair of grooves extending parallel to the other border of said plate each beginning at a point near the edge of the plate opposite to the one border thereof and extending a substantial distance toward said one border, a first guide having a pair of depending members on its underside, slidably mounted in said first pair of grooves for movement toward and away from one edge of the modules assembled in said copy board, and a second guide having a pair of depending members on its underside slidably mounted in said second pair of grooves for movement toward and away from another edge and said modules assembled on said copy board.

2. Copy board according to claim 1 in combination with means locking one of said guides against the edge of the assembled modules.

3. Copy board assembly for composing a newspaper layout comprising a flat four-sided plate of translucent material, means forming raised borders along two adjacent edges of said plate, means forming a first pair of spaced-apart parallel grooves in said plate, said grooves extending parallel to one raised border of said plate, each beginning at a point near the edge of the plate opposite to the other raised border thereof and extending a substantial distance toward said other border, means forming a second pair of spaced-apart parallel grooves in said plate, said second pair of grooves extending parallel to the other border of said plate, each beginning at a point near the edge of the plate opposite to the one border thereof and extending a substantial distance toward said one border, a plurality of translucent plastic modules assembled on said plate in a desired layout, each of said modules bearing artwork on its upper face and forming when assembled an overall generally rectilinear composition having two adjacent edges pressed against the raised borders of said plate, a first guide having a pair of depending members on its underside, slidably mounted in said first pair of grooves for movement toward and away from one edge of said assembled modules and adapted to press said modules against one raised border of said plate, and a second guide having a pair of depending members on its underside slidably mounted in said second pair of grooves for movement toward and away from another edge of said assembled modules and adapted to press said modules against another raised border of said plate.

4. Copy board assembly according to claim 3, in combination with means locking one of said guides against an edge of the assembled modules.

* * * * *